(12) United States Patent
Yoshida et al.

(10) Patent No.: US 11,654,578 B2
(45) Date of Patent: May 23, 2023

(54) ROBOT SYSTEM AND OFFSET ACQUISITION METHOD

(71) Applicants: KAWASAKI JUKOGYO KABUSHIKI KAISHA, Kobe (JP); Kawasaki Robotics (USA), INC., Wixom, MI (US)

(72) Inventors: Masaya Yoshida, Himeji (JP); Hajime Nakahara, San Jose, CA (US); George Chin, San Leandro, CA (US); Luc Nguyen, Pleasanton, CA (US)

(73) Assignees: KAWASAKI JUKOGYO KABUSHIKI KAISHA, Kobe (JP); KAWASAKI ROBOTICS (USA), INC, Wixom, MI (US)

( * ) Notice: Subject to any disclaimer, the term of this patent is extended or adjusted under 35 U.S.C. 154(b) by 498 days.

(21) Appl. No.: 17/024,543

(22) Filed: Sep. 17, 2020

(65) Prior Publication Data

US 2022/0080604 A1    Mar. 17, 2022

(51) Int. Cl.
*B25J 15/00* (2006.01)
*B25J 11/00* (2006.01)
*H01L 21/687* (2006.01)
*B25J 9/16* (2006.01)
*B25J 13/08* (2006.01)

(52) U.S. Cl.
CPC ......... *B25J 15/0014* (2013.01); *B25J 9/1664* (2013.01); *B25J 11/0095* (2013.01); *B25J 13/088* (2013.01); *H01L 21/68707* (2013.01)

(58) Field of Classification Search
CPC .. B25J 15/0014; B25J 11/0095; B25J 13/088; B25J 15/0009; B25J 9/1664; H01L 21/68707

USPC .......................................................... 294/213
See application file for complete search history.

(56) References Cited

U.S. PATENT DOCUMENTS

| | | | |
|---|---|---|---|
| 7,048,316 B1 * | 5/2006 | Blank | H01L 21/68707 294/902 |
| 8,141,926 B2 * | 3/2012 | Fujii | H01L 21/68707 414/941 |
| 9,929,034 B2 * | 3/2018 | Goto | H01L 21/67778 |

(Continued)

FOREIGN PATENT DOCUMENTS

JP    2020-087980 A    6/2020

*Primary Examiner* — Paul T Chin
(74) *Attorney, Agent, or Firm* — Metrolex IP Law Group, PLLC (57) ABSTRACT

A robot system according to an embodiment may include a robot, a wafer jig that is held by the robot, a positioning base, a positional displacement detection device, a control part, and an offset acquisition part for acquiring an offset that occurs between a command position for the robot and an actual position. The positioning base includes contacting members. The wafer jig has a tapered surface. The tapered surface guides the wafer jig so that a center of the wafer jig approaches a predetermined position as a position where the taped surface contacts the contacting members is relatively higher. The robot places the wafer jig on the positioning base, then holds and conveys the wafer jig to the positional displacement detection device. The offset acquisition part acquires the offset based on a result in which the positional displacement detection device detects a positional displacement of the conveyed wafer jig.

6 Claims, 6 Drawing Sheets

(56) References Cited

U.S. PATENT DOCUMENTS

| | | | | |
|---|---|---|---|---|
| 10,134,620 | B2* | 11/2018 | Katsuda | H01L 21/677 |
| 10,283,395 | B2* | 5/2019 | Fukushima | H01L 21/67766 |
| 11,365,069 | B2* | 6/2022 | Yun | G02F 1/1303 |
| 11,427,412 | B2* | 8/2022 | Yoshida | H01L 21/67766 |
| 2012/0049555 | A1* | 3/2012 | Fujii | H01L 21/68707 |
| | | | | 294/213 |
| 2016/0055425 | A1* | 2/2016 | Minami | G05B 19/425 |
| | | | | 706/12 |
| 2020/0083073 | A1* | 3/2020 | Yoshida | H01L 21/68707 |
| 2020/0111534 | A1* | 4/2020 | Vali | G11C 11/5671 |
| 2020/0189115 | A1* | 6/2020 | Minami | B25J 9/1697 |
| 2020/0206933 | A1* | 7/2020 | Yoshida | B25J 9/1692 |
| 2022/0193917 | A1* | 6/2022 | Tan | B25J 9/163 |

\* cited by examiner

ROBOT SYSTEM AND OFFSET ACQUISITION METHOD

TECHNICAL FIELD

The present invention relates to an acquisition of an offset that occurs between a command position for a robot and an actual position of the robot realized by the command position.

BACKGROUND ART

Conventionally, a robot system for automatically teaching a conveying position of a semiconductor wafer to a robot arranged in a clean room where the semiconductor wafer (semiconductor substrate) is manufactured, the robot conveying the semiconductor wafer, has been known. Patent Literature 1 (Japanese Patent Application Laid-Open No. 2020-087980, hereinafter, PTL 1) discloses this kind of robot system.

The robot system of PTL 1 includes a robot, two or more reference members, a posture detector, and a control device. The two or more reference members are arranged so as to surround a reference position. Each of the reference member has a first portion with its horizontal cross section increasing downward.

When a workpiece is correctly conveyed to the reference position, the distance between an outer circumference of the workpiece and a proximal end of the first portion in each reference member is defined as a predetermined first threshold. The robot lowers the workpiece toward the reference position while holding the workpiece. At this time, a control loop gain of the robot is, for example, zero. A direction where the robot is moved in the horizontal direction by contacting the workpiece with the first portion, is calculated based on a posture information of the robot detected by the posture detector. The reference position is corrected by adding the first threshold to the calculated moving direction, with respect to the reference position.

SUMMARY OF THE INVENTION

Problems to be Solved by the Invention

The inventors of the present application have found a robot system and an offset acquisition method suitable for an automatic teaching, which are different from the automatic teaching system disclosed in PTL 1.

The present invention has been made in view of the circumstances described above, an object of the present invention is to provide a robot system and an offset acquisition method suitable for an automatic teaching.

Means for Solving the Problems and Effects Thereof

Problems to be solved by the present invention are as described above, and next, means for solving the problems and effects thereof will be described.

According to a first aspect of the present invention, a robot system with the following configuration is provided. That is, the robot system includes a robot, a wafer jig, a positioning base, a positional displacement detection device, a control part, and an offset acquisition part. The robot can hold a wafer with a holding part. The wafer jig is held by the robot. The wafer jig can be placed on the positioning base. The positional displacement detection device is arranged at a position different from the positioning base. The positional displacement detection device can detect displacement of the wafer jig with respect to a detection reference position. The control part gives commands to the robot to control it. The offset acquisition part acquires an offset that occurs between a command position for the robot and an actual position. The positioning base includes contacting members. The contacting members can contact the wafer jig. The wafer jig has a tapered surface. The tapered surface guides the wafer jig so that a center of the wafer jig approaches a predetermined position as a position where the tapered surface contacts the contacting members is relatively higher. The robot places the wafer jig on the positioning base based on commands from the control part, then holds and conveys the wafer jig to the positional displacement detection device. The offset acquisition part acquires the offset based on a result in which the positional displacement detection device detects a positional displacement of the conveyed wafer jig.

In this configuration, when the wafer jig places on the positioning base, a position of the wafer jig is determined by the tapered surface. The robot holds the wafer jig positioned on the positioning base. When an actual position of the holding part at a time of holding the wafer jig has a positional displacement, such positional displacement appears as the positional displacement of the wafer jig in the positional displacement detection device. Therefore, the offset that occurs between the command position for the robot and the actual position can be easily detected by the positional displacement detection device. As such, the offset required to correct the command position for the purpose of improving an operation accuracy of the robot can be automatically acquired via the wafer jig and the positional displacement detection device. Accordingly, significant labor-saving can be achieved.

According to a second aspect of the present invention, an offset acquisition method with the following configuration is provided. That is, the offset acquisition method acquires the offset that occurs between the command position for the robot and the actual position, in a robot system including a robot, a wafer jig, a positioning base, a positional displacement detection device, and a control part. The robot can hold a wafer with a holding part. The robot holds the wafer jig. The wafer jig can be placed on the positioning base. The positional displacement detection device is arranged at a position different from the positioning base. The positional displacement detection device can detect a positional displacement of the wafer jig with respect to a detection reference position. The control part gives commands to the robot to control it. The positioning base includes contacting members capable of contacting the wafer jig. The wafer jig has a tapered surface. The tapered surface guides the wafer jig so that a center of the wafer jig approaches the predetermined position as a position where the taped surface contacts the contacting members is relatively high. The method includes a first step, a second step, and a third step. In the first step, the control part commands the robot to place the wafer jig on the positioning base. In the second step, the control part commands the robot to hold the wafer jig and convey it to the positional displacement detection device. In the third step, the offset is acquired based on a result in which the positional displacement detection device detects a positional displacement of the conveyed wafer jig.

In this method, when the wafer jig places on the positioning base, a position of the wafer jig is determined by the tapered surface. After that, the robot holds the wafer jig positioned on the positioning base. When an actual position of the holding part at a time of holding the wafer jig has a positional displacement, such positional displacement appears as the positional displacement of the wafer jig in the positional displacement detection device. Therefore, the offset that occurs between the command position for the robot and the actual position can be easily detected by the positional displacement detection device. As such, the offset required to correct the command position for the purpose of improving an operation accuracy of the robot can be automatically acquired via the wafer jig and the positional displacement detection device. Accordingly, significant labor-saving can be achieved.

Effects of Invention

According to the present invention, a robot system and an offset acquisition method suitable for an automatic teaching can be provided.

EMBODIMENT FOR CARRYING OUT THE INVENTION

Figure 1:
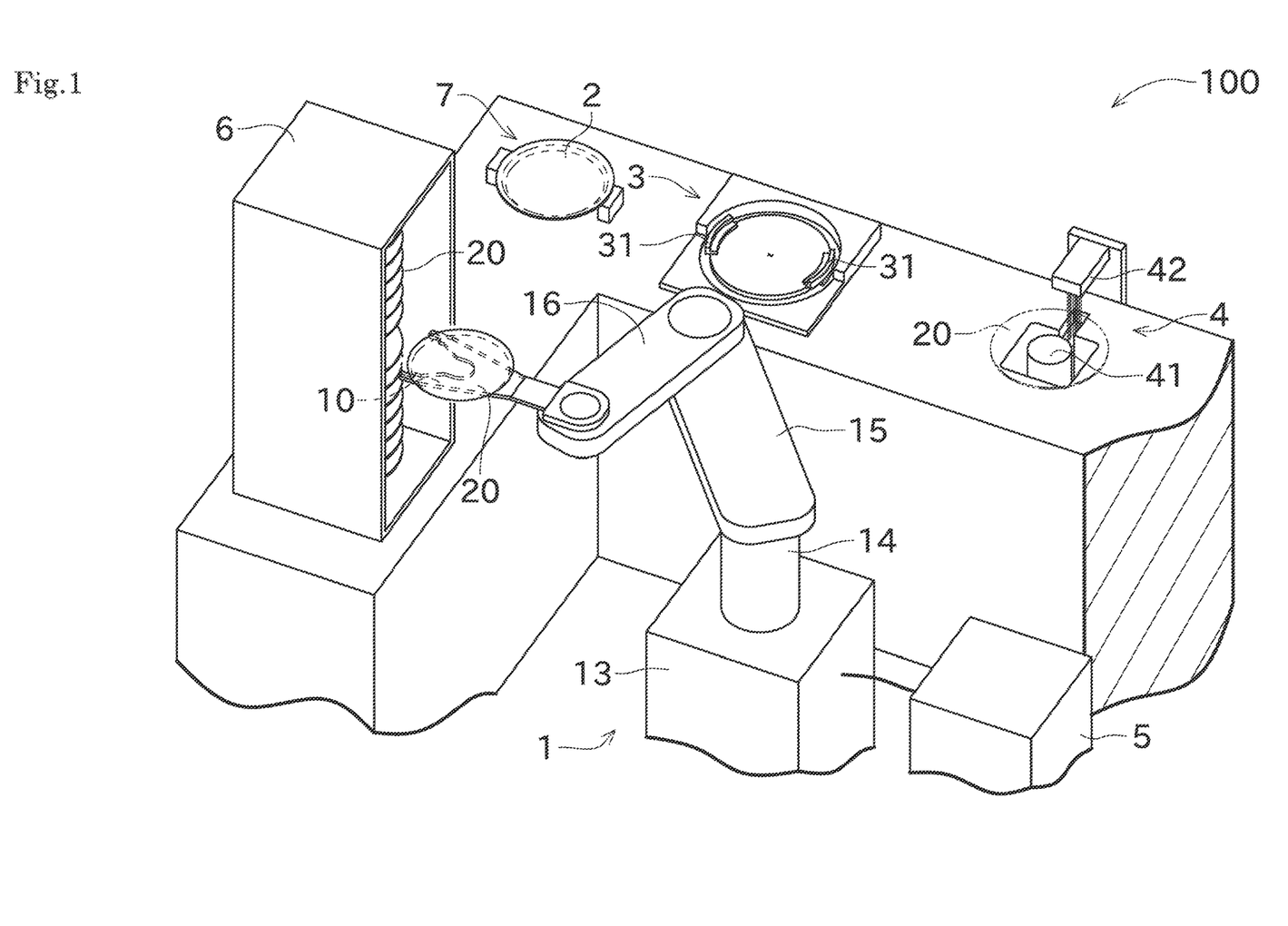
FIG. 1 is a perspective view showing a configuration of a robot system according to an embodiment of the present invention.
Figure 2:
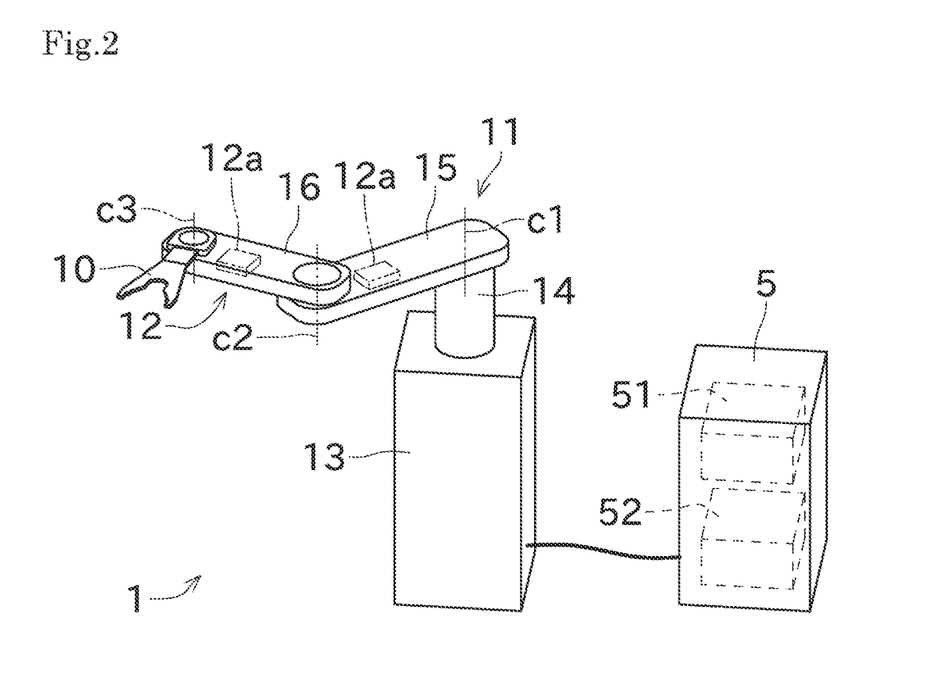
FIG. 2 is a perspective view showing a configuration of a robot.
Figure 3A:
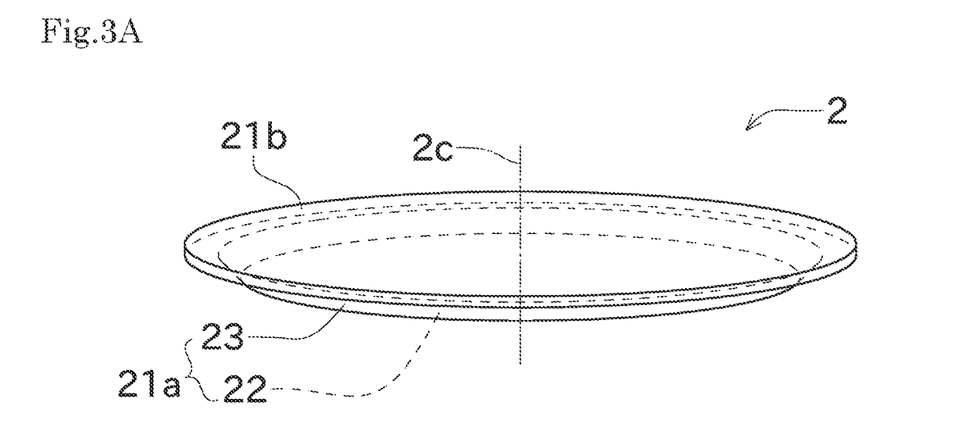
FIG. 3A is a perspective view showing a configuration of a wafer jig and FIG. 3B a side view showing the configuration of the wafer jig.
Figure 3B:
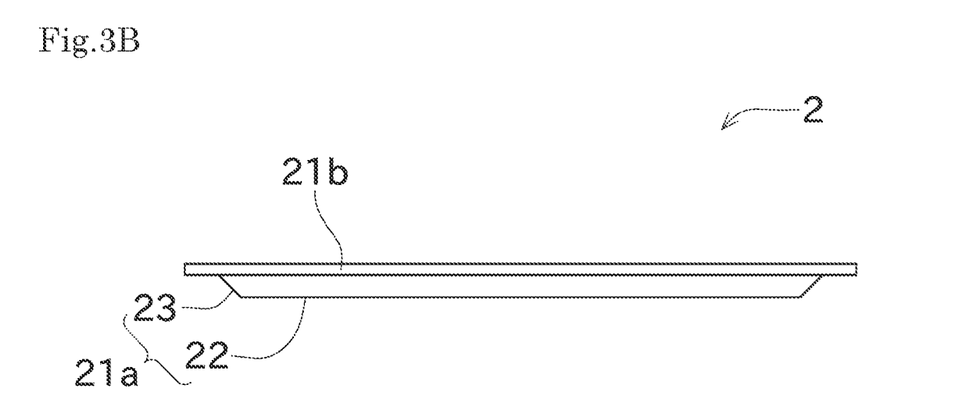
Figure 4A:
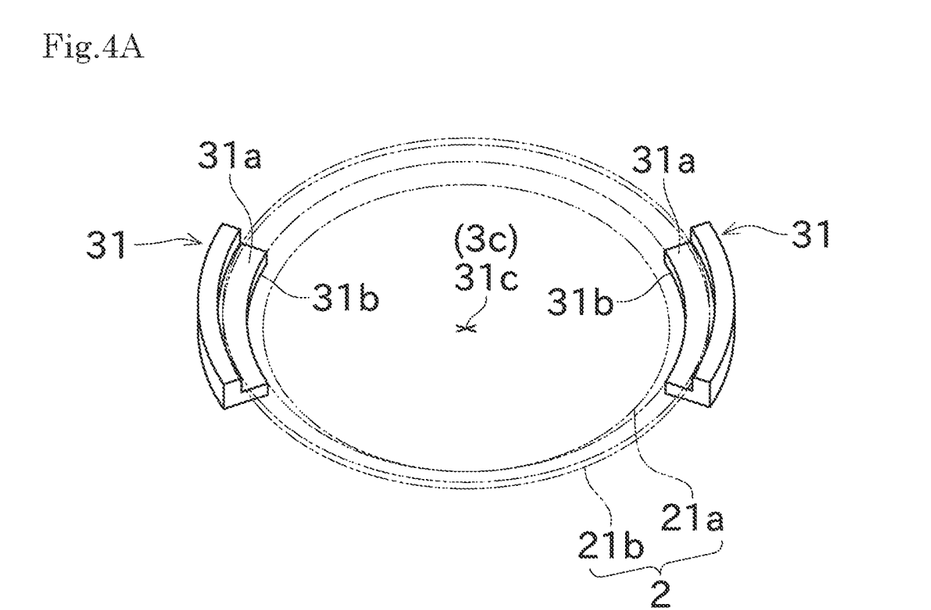
FIG. 4A is a perspective view showing a configuration of the contacting members and FIG. 4B a side cross-sectional view showing a wafer jig and contacting members.
Figure 4B:
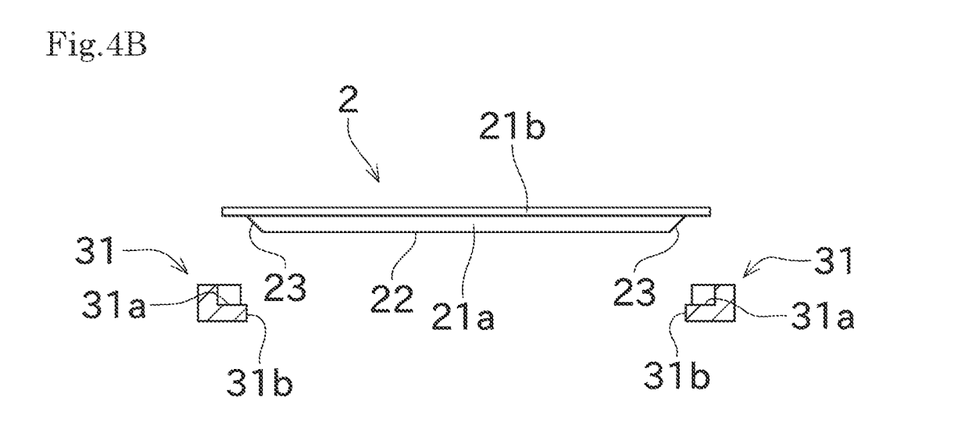
Figure 5:
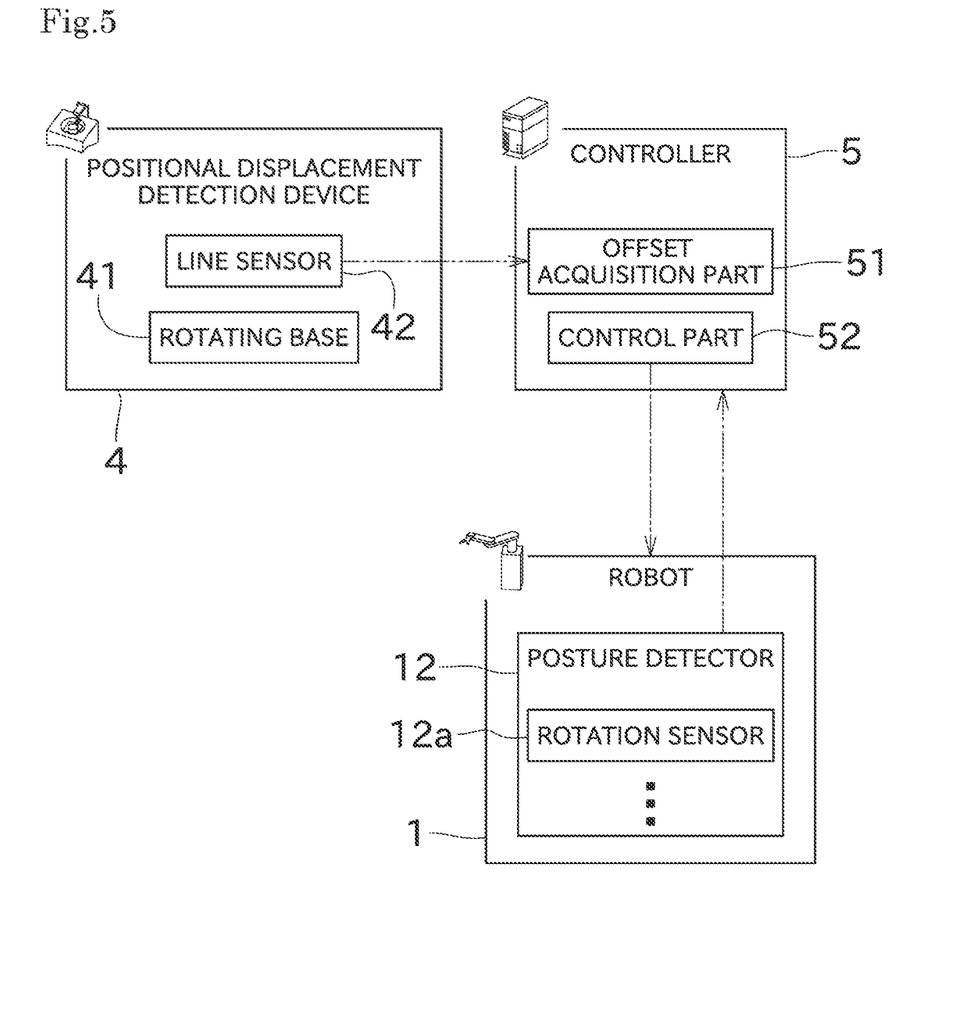
FIG. 5 is a block diagram showing a configuration of a part of a robot system.

Next, an embodiment of the present invention will be described with reference to drawings. FIG. 1 is a perspective view showing a configuration of a robot system 100 according to one embodiment of the present invention. FIG. 2 is a perspective view showing a configuration of a robot 1. FIG. 3A is a perspective view showing a configuration of a wafer jig 2. FIG. 3B is a side view showing a configuration of the wafer jig 2. FIG. 4A is a perspective view showing a configuration of contacting members 31. FIG. 4B is a side cross-sectional view showing the wafer jig 2 and the contacting members 31. FIG. 5 is a block diagram showing a configuration of a part of the robot system 100.

The robot system 100 shown in FIG. 1 is a system that allows the robot 1 to work in a work space such as a clean room.

The robot system 100 includes the robot 1, the wafer jig 2, a positioning base 3, a positional displacement detection device 4, and a controller 5.

The robot 1 functions as a wafer transfer robot for conveying a wafer 20 stored in a storage device 6, for example. In this embodiment, the robot 1 is achieved by a SCARA type horizontal articulated robot. SCARA is an abbreviation for Selective Compliance Assembly Robot Arm.

As shown in FIG. 2, the robot 1 includes a hand (holding part) 10, a manipulator 11, and a posture detector 12.

The hand 10, which is a kind of end effector, is generally formed in a V-shape or a U-shape in a plan view. The hand 10 is supported by a tip of the manipulator 11 (specifically, a second link 16 which will be described later). The hand 10 rotates around a third axis $c_3$ extending in the vertical direction with respect to the second link 16.

The manipulator 11 mainly includes a base 13, a lifting shaft 14, a plurality of links (here, a first link 15 and the second link 16).

The base 13 is fixed to the ground (for example, a floor of the clean room). The base 13 functions as a base member that supports the lifting shaft 14.

The lifting shaft 14 moves in the vertical direction with respect to the base 13. With such lifting, the heights of the first link 15, the second link 16, and the hand 10 can be changed.

The first link 15 is supported on top of the lifting shaft 14. The first link 15 rotates about a first axis $c_1$ extending in the vertical direction with respect to the lifting shaft 14. Accordingly, a posture of the first link 15 can be changed within a horizontal plane.

The second link 16 is supported by a tip of the first link 15. The second link 16 rotates about a second axis $c_2$ extending in the vertical direction with respect to the first link 15. Accordingly, a posture of the second link 16 can be changed within the horizontal plane.

The posture detector 12 includes a plurality of rotation sensors 12a. For example, an encoder constitutes the rotation sensors 12a. Each rotation sensor 12a detects a rotation position of each drive motor (not shown) that drives the hand 10, the first link 15, and the second link 16, respectively. Each rotation sensor 12a is electrically connected to the controller 5 and transmits the detected rotation position to the controller 5.

The wafer jig 2 is a jig that imitates the wafer 20. The wafer jig 2 is formed in a substantially disk shape as a whole. The wafer jig 2 is formed thicker than the wafer 20. Accordingly, a tapered surface 23 which will be described later can be easily formed on the wafer jig 2.

The wafer jig 2 includes a positioning body 21a and a flange part 21b, as shown in FIGS. 3A and 3B. The positioning body 21a and the flange part 21b are integrally formed therewith.

The wafer jig 2 is generally used with the positioning body 21a protruding downward from the flange part 21b. Therefore, an end face on the protruding side of the flange part 21b can be defined as a bottom surface 22 of the wafer jig 2.

The flange part 21b is formed in a circular flat plate shape. The flange part 21b is arranged on an outer circumference of the positioning body 21a. The diameter of the flange part 21b is equal to that of the wafer 20 to be conveyed by the robot 1. A center of the flange part 21b coincides with a central axis 2c of the wafer jig 2. The flange part 21b is arranged perpendicular to the central axis 2c.

The bottom surface 22 is formed into a circular planar shape. The diameter of the bottom surface 22 is smaller than that of the flange part 21b. A center of the bottom surface 22 coincides with the central axis 2c of the wafer jig 2. The bottom surface 22 is arranged perpendicular to the central axis 2c.

The tapered surface 23 is formed on the outer circumference of the positioning body 21a. With the wafer jig 2 oriented horizontally, the tapered surface 23 is arranged between the flange part 21b and the bottom surface 22 in a height direction. The tapered surface 23 is formed into a conical shape whose diameter decreases as separating from the flange part 21b (as approaching the bottom surface 22).

The diameter of a portion of the tapered surface 23 closest to the flange part 21*b* is slightly smaller than that of the flange part 21*b*.

The positioning body 21*a* includes the bottom surface 22 and the tapered surface 23 as described above, and thereby has a thin inverted truncated conical shape.

The positioning base 3 is used for placing the wafer jig 2 in a preset reference position.

As shown in FIG. 1, the positioning base 3 includes a pair of contacting members 31 for fitting the wafer jig 2. The shapes of the two contacting members 31 are identical to each other. The two contacting members 31 form a stage for setting the wafer jig 2.

As shown in FIG. 4A, each contacting member 31 is formed into an arc shape in a plan view.

As shown in FIGS. 4A and 4B, each contacting member 31 is formed into a stepped shape. Each horizontal support surface 31*a* is formed on such stepped portion. The flange part 21*b* can be placed on each support surface 31*a*. Since each support surface 31*a* in the two contacting members 31 has the same height, the wafer jig 2 placed so as to straddle the two support surfaces 31*a* is horizontal.

Arc-surface regulating surfaces 31*b* are formed on inner peripheral surfaces of the contacting members 31. The regulating surfaces 31*b* are arranged at a position lower than the support surfaces 31*a*. The regulating surfaces 31*b* are perpendicular to the support surfaces 31*a*. The pair of contacting members 31 is arranged so that an arc center of each regulating surface 31*b* coincides with each other. In FIG. 4A, such arc center is indicated by a reference number 31*c*. The arc center 31*c* can also be considered as a center 3*c* of the positioning base 3.

Therefore, even when there is a slight positional displacement in the plan view at a time of placing the wafer jig 2 between the two contacting members 31, holding of the wafer jig 2 is released with a gap in the vertical direction between each support surface 31*a* and the flange part 21*b*. This results in, in a process of dropping the wafer jig 2 by its own weight, a guiding action of the tapered surfaces 23 and the regulated surfaces 31*b*.

The detailed description is as follows. It is assumed that each tapered surface 23 of the wafer jig 2 contacts each contacting member 31 (specifically, a boundary between each regulating surface 31*b* and each support surface 31*a*). As described above, each tapered surface 23 has the diameter decreasing as approaching downward. Due to such tapered shape, when the wafer jig 2 tries to move down by its own weight, a position where each contacting member 31 contacts each tapered surface 23 is gradually relatively high. Accordingly, each tapered surface 23 is pushed by each contacting member 31. This can make the central axis 2*c* of the wafer jig 2 approach the arc center 31*c*, which is the center 3*c* of the positioning base 3, in the plan view.

The diameter of the arc portion in each regulating surface 31*b* has the same diameter of a portion closest to the flange part 21*b*, on each tapered surface 23 of the wafer jig 2. Therefore, when the flange part 21*b* of the wafer jig 2 contacts each support surface 31*a*, the central axis 2*c* of the wafer jig 2 can coincide with the arc center 31*c* of each regulating surface 31*b*. In other words, the arc center 31*c* is a predetermined position as a target of positioning.

As such, positioning of the wafer jig 2 in the plan view is realized. Depending on the extent to which a positioning error in the plan view can be accepted, the diameter of the arc of each regulating surface 31*b* may be larger than that of a portion closest to the flange part 21*b*, on each tapered surface 23 of the wafer jig 2.

Positioning of the wafer jig 2 in the height direction is realized by contacting the flange part 21*b* with each support surface 31*a*.

The positional displacement detection device 4 is constituted by, for example, a prealigner (wafer aligner). As shown in FIG. 1, the positional displacement detection device 4 includes a rotating base 41 and a line sensor 42. The prealigner is originally used for the wafer 20, but in this embodiment, also used for detecting a positional displacement of the wafer jig 2.

The rotating base 41 can allow the wafer jig 2 (wafer 20) to be rotated by an electric motor (not shown). The rotating base 41 is rotated with the wafer jig 2 (wafer 20) placed thereon. The rotating base 41 is formed, for example, in a columnar shape, as shown in FIG. 1, but this is not limited thereto.

The line sensor 42 is constituted by, for example, a transmissive sensor including a light emitting part and a light receiving part. The light emitting part and the light receiving part are arranged so as to face each other, at a predetermined interval in the vertical direction. The line sensor 42 emits the detected light through the light emitting part arranged in a radial direction of the rotating base 41, and receives the detected light through the light receiving part provided below the light emitting part. The detected light may be, for example, laser light. When the wafer jig 2 (wafer 20) is placed on the rotating base 41, its outer edge is located between the light emitting part and the light receiving part.

The line sensor 42 is electrically connected to an offset acquisition part 51 which will be described later. The line sensor 42 transmits a detection result of the light receiving part to the offset acquisition part 51. The change in the detection result of the light receiving part at a time of rotating the rotating base 41 depends on a shape of the outer edge of the wafer jig 2 (wafer 20). The details will be described later. With the shape of such outer edge, the positional displacement in which the center of the wafer jig 2 (wafer 20) is displaced from a center of rotation of the rotating base 41 can be detected. Therefore, in the positional displacement detection device 4, the detection reference position of the positional displacement is the center of rotation of the rotating base 41. The offset acquisition part 51 acquires the offset amount of the wafer jig 2 (wafer 20).

The line sensor 42 may be constituted by, for example, a reflective sensor, not limited to the transmissive sensor.

The controller 5 includes an acquisition part 51 and a control part 52, as shown in FIG. 5, etc. The controller 5 is configured as a known computer having a CPU, a ROM, a RAM, and an auxiliary storage, etc. The auxiliary storage is configured as, for example, a HDD, a SSD, etc. The auxiliary storage stores a robot control program, etc. for realizing the offset acquisition method of the present invention. With cooperation of these hardware and software, the controller 5 can be operated as the offset acquisition part 51, and the control part 52, etc.

The offset acquisition part 51 acquires the amount of offset of the wafer 20 (that is, the wafer jig 2) based on the detection result from the line sensor 42, as described above.

The control part 52 outputs a command value to each drive motor that drives each part of the above-described robot 1 in accordance with a predetermined operation program or movement command that is input from the user, and controls to move the hand 10 to a predetermined command position.

Next, in the robot system 100 of this embodiment, details of a method for acquiring an offset required to correct the command position for the robot 1 will be described.

The wafer jig 2 is stored in an appropriate storage position 7 as shown in FIG. 1 when not in use. The robot 1 holds the wafer jig 2 in the storage position 7 and conveys the wafer jig 2 directly above the positioning base 3 in response to control commands from the control part 52.

When the wafer jig 2 is positioned directly above the positioning base 3, the control part 52 controls the robot 1 so that the wafer jig 2 is set between the pair of contacting members 31 of the positioning base 3.

When holding of the wafer jig 2 by the robot 1 is released, the wafer jig 2 is placed on the positioning base 3. At this time, even if the center 3c of the positioning base 3 and the central axis 2c of the wafer jig 2 do not coincide with each other, a guiding action of the above-described tapered surface 23 and each regulating surface 31b causes the wafer jig 2 to be moved so that the central axis 2c coincides with the center 3c of the positioning base 3. As a result, the wafer jig 2 is physically and accurately positioned by the positioning base 3.

After that, the control part 52 controls the robot 1 to hold the wafer jig 2 placed on the positioning base 3, at the predetermined command position. This command position is typically set at a position where the center of the hand 10 coincides with the center 3c of the positioning base 3. However, tolerance, etc. of the robot 1 may cause a positional displacement between the command position and the actual position. Due to this positional displacement, the wafer jig 2 is held in a state where its center is displaced with respect to the center of the hand 10. In the following, this displacement may be referred as a holding displacement.

The control part 52 further controls the robot 1 and conveys the held wafer jig 2 to the rotating base 41 of the positional displacement detection device 4. At this time, the command position is defined at a position where the center of the hand 10 coincides with the center of rotation of the rotating base 41. A positional relationship between the center 3c of the positioning base 3 and the center of rotation of the rotating base 41 is accurately pre-measured, and conveying commands based on such positional relationship is taught to the robot 1. Therefore, the holding displacement when the robot 1 holds the wafer jig 2 of the positioning base 3 appears as a displacement between the central axis 2c of the wafer jig 2 placed on the rotating base 41 and the center of rotation of the rotating base 41.

The positional displacement detection device 4 causes the rotating base 41 to be rotated while continuously detecting a peripheral position of the wafer jig 2 by the line sensor 42. The central axis 2c of the wafer jig 2 completely coincides with the center of rotation of the rotating base 41 is constant regardless of a rotation phase of the rotating base 41. When the center of the wafer jig 2 is displaced from the center of the rotating base 41, the periphery position of the wafer jig 2 changes with an amplitude depending on a displacement distance, in conjunction with rotation of the rotating base 41. In addition, the direction of displacement can be obtained, for example, based on the phase of the rotating base 41 at which the peripheral position becomes maximum or the minimum.

The offset acquisition part 51 acquires the amount of displacement based on the detection result of the line sensor 42. The amount of displacement shows the direction and the distance in which the central axis 2c of the wafer jig 2 is displaced with respect to the center of rotation of the rotating base 41. The amount of displacement can be indicated by, for example, a plane vector (ox, oy). Since a calculation method is known, it is omitted. The amount of displacement can be obtained by a known geometric calculation. The amount of displacement coincides with the above-described amount of offset of the holding displacement. Therefore, the amount of offset can be obtained by obtaining the amount of displacement.

The offset acquisition part 51 transmits the acquired amount of offset to the control part 52. The control part 52 corrects the command position for the hand 10 in the plan view depending on the amount of offset received from the offset acquisition part 51. The corrected command position can be obtained by subtracting the vector of the amount of offset from the previous command position. That is, (corrected command position)=(command position)−(offset amount). The controller 5 provides the corrected command position for the robot 1, which can improve an operation accuracy of the robot 1.

A series of steps of, (1) conveying the wafer jig 2 from the storage position 7 to the positioning base 3, (2) conveying the wafer jig 2 from the positioning base 3 to the positional displacement detection device 4, (3) acquiring the positional displacement of the wafer jig 2 in the positional displacement detection device 4, (4) acquiring the amount of offset, and (5) conveying the wafer jig 2 from the positional displacement detection device 4 to the storage position 7, is stored in the controller 5 as a program. Therefore, a series of operations to obtain the above-described offset and correct the command position can be completely automated by using the wafer jig 2 and the positional displacement detection device 4.

As described above, the robot system 100 of this embodiment includes the robot 1, the wafer jig 2, the positioning base 3, the positional displacement detection device 4, the control part 52, and the offset acquisition part 51. The robot 1 can hold the wafer 20 with the hand 10. The wafer jig 2 is held by the robot 1. The wafer jig 2 can be placed on the positioning base 3. The positional displacement detection device 4 is arranged at a position different from the positioning base 3. The positional displacement detection device 4 can detect the positional displacement of the wafer jig 2 with respect to the center of rotation of the rotating base 41. The control part 52 gives commands to the robot 1 to control it. The offset acquisition part 51 acquires the offset that occurs between the command position 1 for the robot 1 and the actual position. The positioning base 3 includes the pair of contacting members 31. Each contacting member 31 can contact the wafer jig 2. The wafer jig 2 has the tapered surface 23. The tapered surface 23 guides the wafer jig 2 so that the center of the wafer jig 2 approaches the predetermined position (the center 3c of the positioning base 3) as a position where the tapered surface 23 contacts the contacting members 31 becomes relatively higher. The robot 1 places the wafer jig 2 on the positioning base 3 based on the commands from the control part 52, then holds and conveys the wafer jig 2 to the positional displacement detection device 4. The offset acquisition part 51 acquires the offset based on a result in which the positional displacement detection device 4 detects the positional displacement of the conveyed wafer jig 2.

In this configuration, when the wafer jig 2 is placed on the positioning base 3, a position of the wafer jig 2 is defined by the tapered surface 23. After that, the robot 1 holds the wafer jig 2 positioned on the positioning base 3. When the actual position of the hand 10 at a time of holding the wafer jig 2 has a positional displacement, such positional displacement appears in the positional displacement detection device 4, as the positional displacement of the wafer jig 2. Therefore, the offset that occurs between the command position for the robot 1 and the actual position can be easily detected by the positional displacement detection device 4. As such, the offset required to correct the command position for the purpose of improving an operation accuracy of the robot 1 can be automatically acquired via the wafer jig 2 and the positional displacement detection device 4. Accordingly, significant labor-saving can be achieved.

In the robot system 100 of this embodiment, the tapered surface 23 is formed around a circular bottom surface of the wafer jig 2.

Accordingly, since the tapered surface 23 with a large diameter can be obtained, a positioning accuracy of the center of the wafer jig 2 can be improved.

In the robot system 100 of this embodiment, the wafer jig 2 has a thicker portion than the wafer 20.

Accordingly, the tapered surface 23 can be easily arranged in the wafer jig 2.

In the robot system 100 of this embodiment, the plurality of contacting members 31 are arranged on the positioning base 3.

Accordingly, with the positioning at multiple positions, a positioning accuracy of the center of the wafer jig 2 can be improved.

Figure 6:
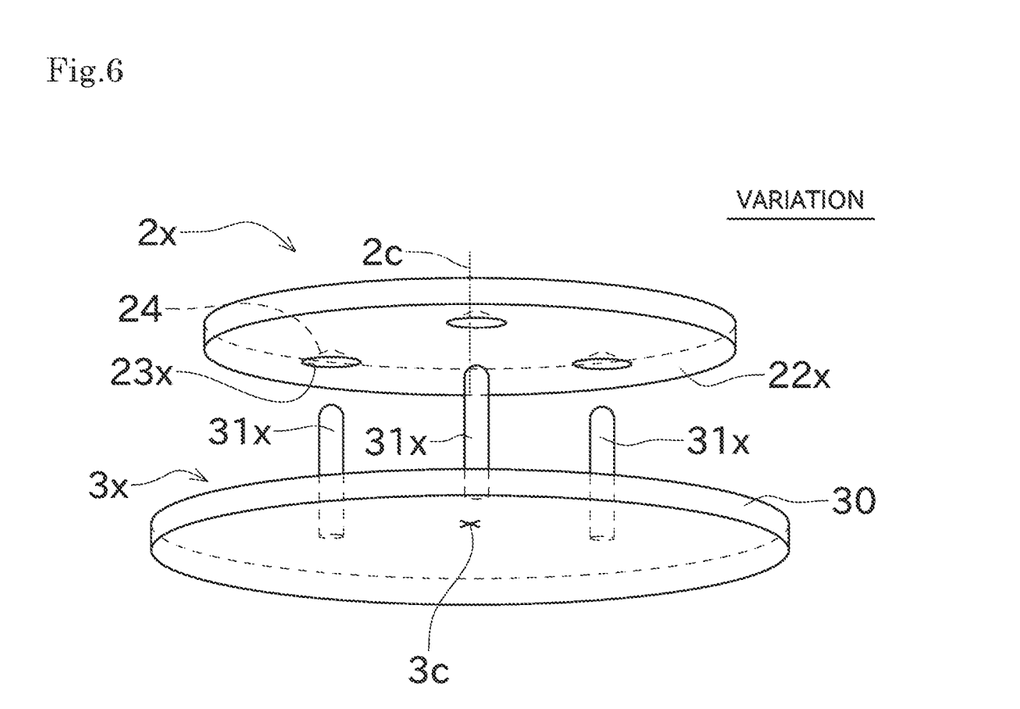
FIG. 6 is a drawing showing a variation of a wafer jig.

Next, a variation of the above-described embodiment will be described. FIG. 6 is a drawing showing a variation of a wafer jig 2x. In the description of the variation, members identical or similar to those of the above-described embodiment may not be described and instead the same reference signs as in the above-described embodiment are given on the drawings.

The wafer jig 2x of the variation is configured to, as shown in FIG. 6, omit the flange part 21b of the above-described embodiment, and correspond only to the positioning body 21a. The outer peripheral surface of the wafer jig 2x is parallel to the central axis 2c. In other words, the wafer jig 2x has no tapered surface on the outer circumference thereof.

A plurality of (three, in this embodiment) conical insertion holes 24 are formed on a bottom surface 22x of the wafer jig 2x. An inner peripheral surface of each insertion hole 24 forms the tapered surface 23x. The tapered surface 23x expands so that its diameter increases downward.

A positioning base 3x corresponding to the wafer jig 2x includes a disc-shaped base part 30 and a plurality of (three, in this embodiment) contacting members 31x.

Each contacting member 31x is formed by a rod-shaped member with its hemispherical tip. Each contacting member 31x is provided so as to project upward from the base part 30 with its longitudinal direction facing up and down. Each contacting member 31x is provided at each corresponding insertion hole 24 of the wafer jig 2x.

In the variation, the tapered surface 23x can guide the wafer jig 2x so that the central axis 2c of the wafer jig 2x approaches the predetermined position, as the position where the tapered surface 23x contacts each contacting member 31x becomes relatively higher. As a result, the wafer jig 2x is preferably guided by the tapered surface 23x so that the center of the wafer jig 2x is located on the same vertical line as the center 3c of the positioning base 3x.

The number of contacting members 31x and insertion holes 24 may be four or more, or 2 or less. In one or two contacting members 31x, it is preferable to provide one or more support members (not shown) that contact and support the bottom surface 22x of the wafer jig 2x on the positioning base 3, and thereby, the wafer jig 2x can be stabilized.

As described above, in the robot system 100 having the wafer jig 2x of the variation, the bottom surface of wafer jig 2x has the insertion holes 24 into which the contacting members 31x can be inserted from below. The tapered surface 23x is arranged in each insertion hole 24.

Accordingly, a size of each contacting member 31x can be reduced.

Although a preferred embodiment and a variation of the present invention has been described above, the above-described configuration can be modified, for example, as follows.

In the above-described embodiment, the offset acquisition part 51 acquires the offset based on the detection result of the line sensor 42 of the positional displacement detection device 4. Instead, the positional displacement detection device 4 may calculate the displacement from the center of the rotating base 41 of the wafer jig 2, and then such displacement may be transmitted from the positional displacement detection device 4 to the controller 5. In this case, the offset acquisition part 51 acquires the offset based on the amount of displacement in which the controller 5 has received from the positional displacement detection device 4.

Control in the positional displacement detection device 4 (for example, control of the electric motor that drives the rotating base 41) may be performed by a controller independently provided in the positional displacement detection device 4, or by the controller 5 controlling the robot 1. When control of the robot 1 and control of the positional displacement detection device 4 are performed by the one controller 5, the electric motor that drives the rotating base 41 in the positional displacement detection device 4 and the drive motor that drives each part of the robot 1 are easy to control in a coordinated manner. As a result, accuracy of an offset acquisition can be improved.

Three or more contacting members 31 may be provided in the positioning base 3. Each contacting members 31 may have a different shape.

The outer diameter of the flange part 21b or the outer diameter of the wafer jig 2x may or may not coincide with that of the wafer 20.

The tapered surface 23 may be formed on the contacting members 31, instead of the wafer jig 2.

The flange part 21b may be formed in the wafer jig 2x of the variation.

DESCRIPTION OF THE REFERENCE NUMERALS 1 robot
2 wafer jig
3 positioning base
10 hand (holding part)
23 tapered surface
31 contacting member
51 offset acquisition part
52 control part
100 robot system

The invention claimed is:

1. A robot system comprising:
a robot capable of holding a wafer with a holding part;
a wafer jig that is held by the robot;
a positioning base where the wafer jig can be placed;
a positional displacement detection device that is arranged at a position different from the positioning base, the positional displacement detection device capable of detecting a positional displacement of the wafer jig with respect to a detection reference position;
a control part for controlling the robot by giving commands to the robot; and an offset acquisition part for acquiring an offset that occurs between a command position for the robot and an actual position, wherein the positioning base includes contacting members capable of contacting the wafer jig, the wafer jig has a tapered surface, the tapered surface guides the wafer jig so that a center of the wafer jig approaches a predetermined position as a position where the tapered surface contacts the contacting members is relatively higher, the robot places the wafer jig on the positioning base based on commands from the control part, then holds and conveys the wafer jig to the positional displacement detection device, the offset acquisition part acquires the offset based on a result in which the positional displacement detection device detects a positional displacement of the conveyed wafer jig.

2. The robot system according to claim 1, wherein the tapered surface is formed around a circular bottom surface of the wafer jig.

3. The robot system according to claim 1, wherein insertion holes capable of inserting the contacting members from below are formed on a bottom surface of the wafer jig, the tapered surface is arranged on each insertion hole.

4. The robot system according to claim 1, wherein the wafer jig has a thicker portion than a wafer.

5. The robot system according to claim 1, wherein a plurality of the contacting members are arranged on the positioning base.

6. An offset acquisition method for acquiring an offset that occurs between a command position for a robot and an actual position, in a robot system including: a robot capable of holding a wafer with a holding part; a wafer jig that is held by the robot; a positioning base where the wafer jig can be placed; a positional displacement detection device that is arranged at a position different from the positioning base, the positional displacement detection device capable of detecting a positional displacement of the wafer jig with respect to a detection reference position; and a control part for controlling the robot by giving commands to the robot, wherein the positioning base includes contacting members capable of contacting the wafer jig, the wafer jig has a tapered surface, the tapered surface guides the wafer jig so that a center of the wafer jig approaches a predetermined position as a position where the taped surface contacts the contacting members is relatively higher, the method comprising:

a first step in which the control part commands the robot to place the wafer jig on the positioning base;

a second step in which the control part commands the robot to hold the wafer jig and convey it to the positional displacement detection device; and a third step of acquiring the offset, based on a result in which the positional displacement detection device detects a positional displacement of the conveyed wafer jig.

* * * * *